United States Patent [19]

Richter, Jr. et al.

[11] 4,199,953
[45] Apr. 29, 1980

[54] TEMPERATURE STABILIZATION SYSTEM

[75] Inventors: Albert P. Richter, Jr.; Harold E. Peelman, both of Houston, Tex.

[73] Assignee: Texaco Inc., White Plains, N.Y.

[21] Appl. No.: 870,560

[22] Filed: Jan. 19, 1978

[51] Int. Cl.² .................. F25B 21/02; F25B 19/00
[52] U.S. Cl. ........................ 62/3; 62/467 R; 62/514 R
[58] Field of Search .................. 62/3, 467, 514

[56] References Cited

U.S. PATENT DOCUMENTS

| | | | |
|---|---|---|---|
| 3,230,773 | 1/1966 | Matthews | 62/3 |
| 3,289,422 | 12/1966 | Fisher | 62/3 |
| 3,422,886 | 1/1969 | Buller | 62/467 |
| 3,451,641 | 6/1969 | Leventhal | 62/3 |
| 3,973,938 | 8/1976 | Szabo et al. | 62/3 |
| 4,030,316 | 6/1977 | Aronson | 62/467 |
| 4,121,434 | 10/1978 | Annable | 62/51 X |

*Primary Examiner*—Lloyd L. King
*Attorney, Agent, or Firm*—Carl G. Ries; Thomas H. Whaley; Gregory A. Cone

[57] ABSTRACT

A radiation detector assembly is enclosed in a heat pipe which is positioned in a dewar flask. A thermo-electric cooler is joined to one end of the heat pipe. The heat exhaust of the thermo-electric cooler is communicated to a heat dissipation device in the form of a fin assembly. A thermistor senses the temperature at the heat pipe. When the thermistor indicates a temperature in excess of that corresponding to a reference signal, a control singal is produced by a control device to cause a power source to operate the thermo-electric cooler to remove heat from the heat pipe to the fin assembly. The vacuum within the dewar flask effectively limits the environmental heat passing to the heat pipe to radiant heat. The detector assembly and temperature stabilization system may extend to the interior of a conduit or other housing containing material whose radiation is to be detected, while the fin assembly is exposed to the atmosphere. In particular, the temperature stabilization system may be used in conjunction with a detector comprising a scintillation crystal optically coupled to a photomultiplier tube in an environment which would otherwise diminish the performance of such a detector by raising its temperature.

11 Claims, 3 Drawing Figures

U.S. Patent  Apr. 29, 1980  4,199,953
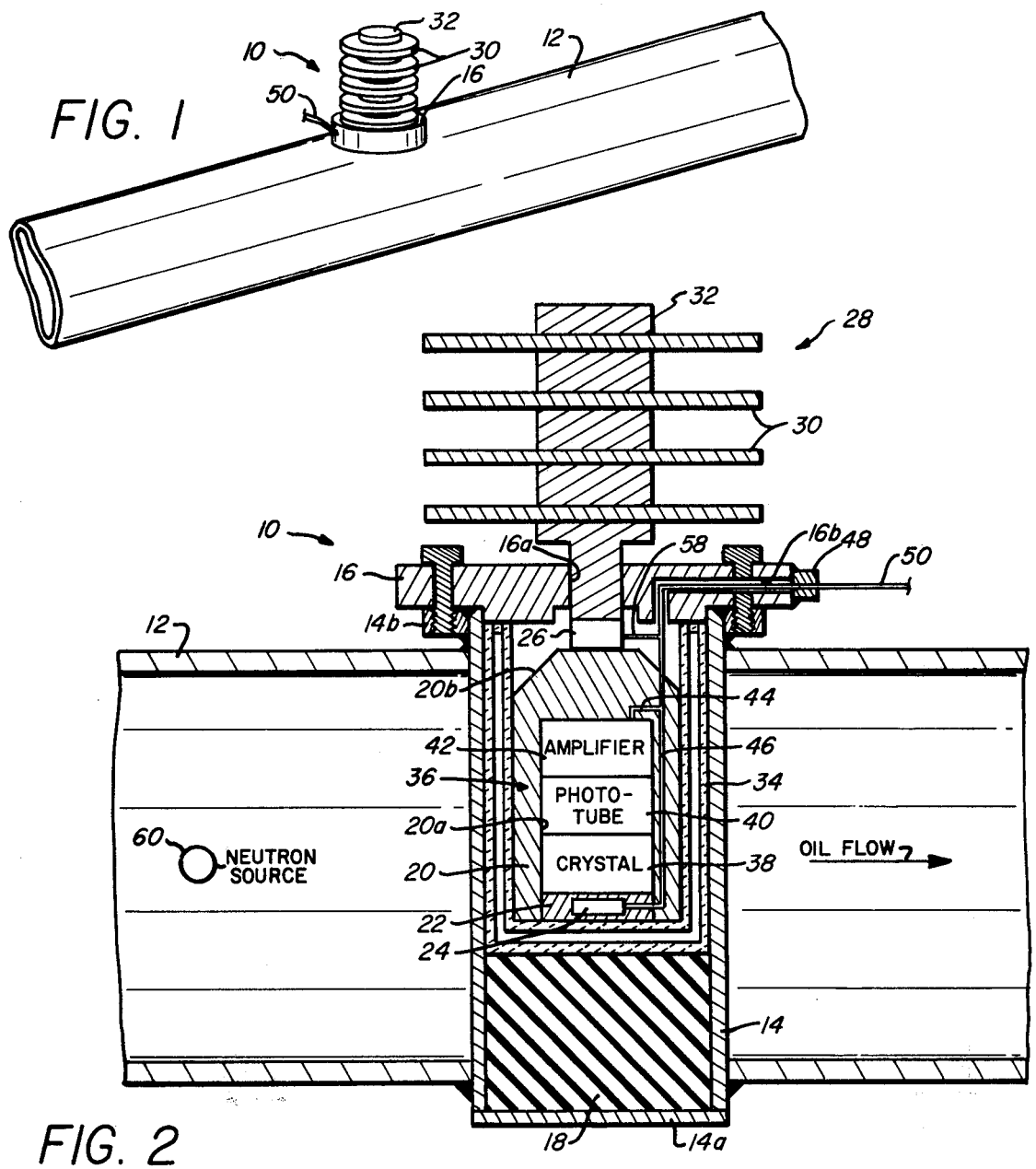
FIG. 1
FIG. 2
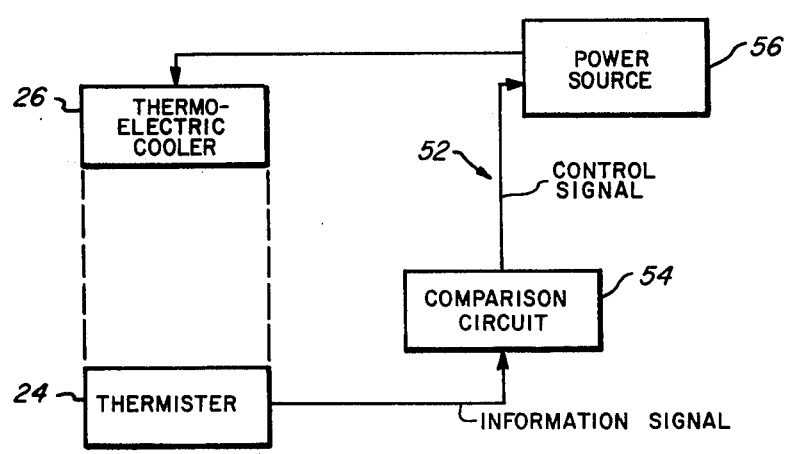
FIG. 3

TEMPERATURE STABILIZATION SYSTEM

BACKGROUND OF THE INVENTION

The present invention pertains to methods and apparatus for maintaining the temperature of an area or apparatus at a predetermined value. More particularly, the present invention relates to techniques for stabilizing the temperature of heat-sensitive equipment, such as radiation detectors, at sufficiently low temperatures to enhance the performance of such equipment.

Monitoring and measuring techniques employing the activation of materials under investigation, and the detection of resulting radiation find increasing use in the oil industry. One such application involves the monitoring of crude oil flowing in a line between an oil well and a storage tank or other destination. In such an application, small amounts of salt in the crude oil may be detected by utilizing the characteristic gamma radiation emitted by the chlorine in the salt when the chlorine is first activated. A neutron source is placed within the pipeline to radiate the chlorine. A continuous chemical neutron source, such as an actinium berylium source, or a californium 252 source may be used. The radioactive isotope chlorine 36 is generated according to the reaction $Cl^{35}(n,\gamma)Cl^{36}$. Then the unstable chlorine 36 isotope decays by the emission of gamma radiation predominantly in the energy range of 5.5 to 8.0 MEV. The gamma rays may be detected by an appropriate radiation detector placed a short distance downstream within the pipeline.

The radiation detector may be a sodium iodide thallium-activated scintillation crystal. The crystal is optically coupled to a photomultiplier tube. As is well known, gamma rays entering such a crystal interact therewith to produce light falshes, or scintillations, whose intensity is functionally related to the gamma ray energy. The light flashes are then detected by the photomultiplier tube to generate voltage pulses proportional in magnitude, or height, to the intensity of the corresponding light flashes. Thus, a succession of pulses is produced by the photomultiplier tube, wherein each pulse is proportional to the energy of the corresponding incident gamma ray. The pulse stream from the photomultiplier tube is received by an amplifier which amplifies the pulse signal before it is transmitted to appropriate data processing equipment used to analyze the pulse data to acquire information concerning the oil flowing in the pipeline.

In order to function optimally, the scintillation crystal, photomultiplier tube and amplifier must operate at a constant temperature, preferably below room temperature. The photomultiplier tube is particularly sensitive to temperature variations, with the signal-to-noise ratio decreasing as the temperature of the photomultiplier tube increases. Thus, when the detector assembly is exposed to a high temperature environment, such as within a crude oil pipeline, wherein the temperature may be as high as 90° C., a means must be provided to cool and stabilize the detector assembly at or below room temperature.

The detector assembly may be cooled by thermal contact with a coolant. In particular, a phase change material, such as ice or other chemical, may be used to absorb heat, transmitted to the detector assembly, at the phase change temperature. However, such a cooling system is time-dependent, and limited by the volume of phase change material available for thermal communication with the detector assembly.

SUMMARY OF THE INVENTION

The present invention provides a system for stabilizing the temperature of a radiation detector assembly, including a heat pipe which generally encloses the detector assembly. Thus, ambient heat is absorbed by the heat pipe rather than being communicated to the detector assembly. A heat removal device is connected to the heat pipe, and selectively removes heat from the heat pipe to maintain the heat pipe at a predetermined temperature. The heat removal device may be in the form of a thermo-electric cooler, whose hot, or heat exhaust, side is thermally connected to a heat dissipation device. The latter may be a fin assembly, which radiates heat from the thermo-electric cooler into the atmosphere.

A temperature sensing device, such as a thermistor, is applied to the heat pipe to determine its temperature. The thermistor is electrically connected to a control system which then receives an information signal from the thermistor reflecting the value of the temperature measured at the heat pipe. The control device compares the information signal with a reference signal corresponding to a predetermined temperature. A control signal is produced in response to the comparison between the information signal and the reference signal. Whenever the thermistor senses that the temperature of the heat pipe exceeds that of the reference temperature, the control signal triggers a power source which operates the thermoelectric cooler to remove heat from the heat pipe to the fin assembly. Thus, the radiation detector assembly is generally surrounded by a heat absorbing device in the form of the heat pipe from which heat is extracted whenever the temperature of the heat pipe rises above a predetermined level.

The heat pipe is further surrounded by a vacuum chamber which effectively limits the communication of environmental heat to the heat pipe to radiant heat.

For application to detection of radiation from salt contained in crude oil, such as that flowing in a pipeline, the heat stabilization system, containing the radiation detection assembly, may be extended to the interior of the pipeline. For this purpose, for example, the pipeline may be fitted with a through-bore housing that traverses the pipeline. The temperature stabilization system is positioned within the housing, with the fin assembly protruding into the atmosphere.

In the method of the present invention, a radiation detector assembly is housed within a heat pipe, and the latter is provided with a heat removal device such as a thermoelectric cooler. A temperature sensing device, such as a thermistor, is also provided to determine the temperature value at the heat pipe. Further, a control system is provided for comparing the temperature at the heat pipe as detected by the temperature sensing device with a predetermined temperature value. A control signal is produced whenever the temperature of the heat pipe so detected exceeds the value of the reference temperature to trigger a power source which, in turn, operates the heat removal device to so remove heat from the heat pipe. A heat dissipation device, such as a fin assembly, is provided for dissipating heat received by the heat removal device.

It will be appreciated that the method and apparatus of the present invention encompass a technique for stabilizing the temperature of a radiation detector assembly at or below a predetermined temperature value without the need of supplying phase change material or other coolants. With the control system operable in response to a temperature sensing device as described, the present invention may be employed without the need for monitoring the system to determine the extent of its capability for maintaining the desired low temperature of the radiation detector assembly. Furthermore, since the operation of the system of the present invention does not rely upon a supply of coolant material, and is essentially automatic, radiation detector assemblies fitted with the system of the present invention may be remotely located.

BRIEF DESCRIPTION OF THE DRAWINGS

FIG. 1 is a prespective view of a section of pipeline equipped with a through-bore housing containing a temperature stabilization system according to the present invention;

FIG. 2 is a horizontal cross-sectional schematic view of a segment of pipeline showing the installation of a radiation detector assembly and a temperature stabilization system; and FIG. 3 is a schematic representation of a control system for operating the thermo-electric cooler.

DESCRIPTION OF PREFERRED EMBODIMENTS

A temperature stabilization system according to the present invention is shown generally at 10 in FIGS. 1 and 2 installed in a pipeline 12. A cylindrical instrument housing 14 traverses the pipeline 12 to form a through-bore housing between pipe holes 12a and 12b positioned along a diameter of the pipeline 12. An end cap 14a closes the bottom of the housing 14. The top of the housing 14 features a flange 14b to which is bolted a collar 16. Heat insulating material 18 occupies the bottom of the housing.

The temperature stabilization system at 10 includes a metal heat pipe 20 constructed of good heat conducting material, such as copper. The heat pipe 20 is generally cylindrical, and defines a chamber 20a which is closed at the bottom end by a plug 22 of similar good thermal conducting material. A temperature sensing device, such as a thermistor, 24 is embedded in, or otherwise joined to the plug 22. The plug 22 is fitted snugly into the end opening of the heat pipe 20 so as to form a good thermal conduction path therebetween. Thus, with the thermistor 24 in thermal communication with the plug 22, the temperature of the plug as well as that of the lower end of heat pipe 20 may be determined by way of the thermistor.

A heat removal device, such as a thermo-electric cooler, 26 is joined to the top of the heat pipe 20. To provide an efficient heat path to the cooler 26, the heat pipe 20 may feature a frustoconical-shape 20b resulting in an end surface generally as broad as the extent of the cooler. A heat dissipating device, shown generally at 28, is joined to the hot side of the thermo-electric cooler 26 through a central passage 16a in the collar 16. Thus, as the cooler 26 is operated to remove heat from the heat pipe 20, the exhaust heat from the cooler is communicated to the heat dissipating device 28. The device 28 may be a radiating fin assembly as shown, featuring a series of fins 30 that are joined to the thermo-electric cooler 26 by a central core 32. Heat from the cooler 26 is communicated along the core 32 to the fins 30 which provide a large surface area through which the heat may transfer into the atmosphere.

The housing 14 is lined by a dewar flask 34, and the heat pipe 20 is fitted snugly within the dewar flask. The heat pipe 20 is thus substantially surrounded by a vacuum chamber provided by the dewar flask 34. The vacuum effectively limits heat transfer from the environment to the heat pipe 20 to radiant heat which traverses the vacuum.

A radiation detector assembly, shown generally at 36, may be positioned within the heat pipe 20 before the plug 22 is put in place. A typical detector 36 may include a scintillation crystal 38 optically coupled to a photomultiplier tube 40. An amplifier 42 is provided to amplify the pulse signals from the photomultiplier tube. Appropriate electrical connections to the photomultiplier tube 40 and the amplifier 42 may be provided by way of a cable 44 which passes through the heat pipe 20 and along a passage 16b in the collar 16. Similary, appropriate leads 46 pass along the heat pipe 20 from the thermistor 24 and through the passage 16a. A cable connector 48 is provided at the collar 16, and an appropriate cable 50, joined thereto, continues the electrical conductors from the thermistor 24 and the radiation detector assembly 36 to external electronics.

Signal processing circuitry for analyzing the pulse signals from the radiation detector assembly at 36 are known in the art, and are not described in further detail herein. However, FIG. 3 illustrates in block form a control device 52 for selectively operating the thermo-electric cooler 26 to maintain the temperature of the heat pipe 20 at a predetermined value.

Values of resistance of the thermistor 24 are read at the control circuitry 52 as an information input signal reflecting the temperature at the heat pipe 20. The information signal is transmitted, along the leads 46 and cable 50 of FIG. 2, to a comparison circuit 54. The comparison circuit 54 compares the information signal, which may be in the form, for example, of a voltage or a current value, with a reference signal of like form, where the reference signal corresponds to a predetermined temperature value. A control signal is produced by the comparison circuit 54, and transmitted to a power source 56. The value of the control signal is determined by the difference between the information signal from the thermistor 24 and the reference temperature signal. Thus, whenever the comparison of these two latter signals indicates that the temperature measured by the thermistor 24 at the heat pipe 20 is greater than the reference temperature, the control signal takes on a value which triggers the power source 56 to operate the thermo-electric cooler. Then, a voltage difference is applied, by the power source 56, across the cooler 26 by way of appropriate conductors within the cable 50 and leads 58 passing through the passage 16a of the collar 16 to the cooler. As long as the value of the temperature of the heat pipe 20 is detected to be above the value of the reference temperature, the power source 56 is triggered by the control signal from the comparison circuit 54 to so operate the thermo-electric cooler 26, continually removing heat from the heat pipe to the fin assembly at 28. Once the value of the heat pipe temperature is determined to be below that of the reference temperature, the control signal value is changed to no longer trigger the power source 56, and the thermo-electric cooler 26 ceases to operate.

In FIG. 2, a neutron source 60 is shown positioned within the pipeline 12, with the radiation detector assembly 36 and the temperature stabilization system 10 located downstream of the neutron source as indicated by the arrow showing the direction of oil flow. The neutron source 60, shown schematically in FIG. 2, may be of any suitable type known in the art, and is not further described in detail herein. As the oil flows past the neutron source 60, and is radiated thereby, unstable isotope particles, such as chlorine 36, are formed as discussed hereinbefore, and decay by emission of gamma rays which may then be detected by the detector assembly at 36.

While the instrument housing 14 may be a permanent structure within the pipeline 12, the temperature stabilization system at 10, along with the radiation detector assembly at 36, may be freely inserted into the housing 14, or removed therefrom. Furthermore, particular details of construction of the temperature stabilization system at 10 may be varied to accomodate different detector assemblies within the scope of the present invention. For example, the dimensions of the heat pipe 20 may be so altered to house different sized detector assemblies. Also, the design of the heat dissipating device at 28 may chosen to most economically transfer heat to the surrounding atmosphere.

In the method of the invention, a heat pipe 20 is provided to substantially enclose the radiation detector assembly at 36. A temperature sensing device, such as the thermistor 24, is provided to sense the temperature at the heat pipe 20, and a heat removal device, such as the thermo-electric cooler 26, is provided for selectively removing heat from the heat pipe. The temperature of the heat pipe, as indicated by the thermistor 24, is compared to a reference temperature, or corresponding reference signal value. Whenever the comparison indicates that the temperature at the heat pipe 20 is greater than that of the reference temperature, a control signal is produced which triggers a power source to operate the thermo-electric cooler to so remove heat from the heat pipe. A heat dissipating mechanism is also provided to dissipate heat from the heat removal device into the atmosphere. A vacuum chamber is provided to at least partially enclose the heat pipe to effectively reduce the heat transferred to the heat pipe from the environment to radiant heat.

It will be appreciated that the method and apparatus of the present invention provide a technique for maintaining the temperature of a radiation detector, or other instrumentation, at or below a predetermined reference temperature. Furthermore, the temperature stabilization is carried out without the need for consumable coolants. The system is essentially automatic, and requires no operator attention to function once the reference temperature is determined. Additionally, since the temperature stabilization system is self-operable, it may be placed at relatively remote locations.

It should further be noted that the thermoelectric module may also be used to supply heat to the heat pipe if the temperature of the pipe is below the reference temperature. This may be accomplished by simply reversing the polarity of the current and voltage supplied to the thermoelectric module. Thus, the heat control system of the present invention is also suitable for use in extremely cold environments such as in arctic operations.

The foregoing disclosure and description of the invention is illustrative and explanatory thereof, and various changes in the method steps as well as in the details of the illustrated apparatus may be made within the scope of the appended claims without departing from the spirit of the invention.

We claim:

1. A system for stabilizing the temperature of a radiation detector assembly comprising:
    (a) heat pipe means, generally enclosing a radiation detector assembly whereby ambient heat is absorbed by said heat pipe means for effectively communicating the absorbed heat from said detector assembly to a heat removal means;
    (b) temperature sensing means for detecting temperature at said heat pipe means;
    (c) heat removal means comprising a thermo electric cooler for selectively removing heat from said heat pipe means;
    (d) control means, responsive to said temperature sensing means, for controlling said heat removal means for so removing heat from said heat pipe means; and heat dissipation means for receiving heat from said heat removal means and dissipating heat.

2. A system as defined in claim 1 wherein said temperature sensing means is positioned adjacent said heat pipe means, said thermo-electric cooler is positioned adjacent said heat pipe means but distal said temperature sensing means, and said heat dissipating means is connected to the exhaust side of said thermo-electric cooler.

3. A system as defined in claim 2 wherein said heat dissipating means comprises a fin assembly.

4. A system as defined in claim 3 wherein said control means comprises:
    (a) means for comparing an information signal from said temperature sensing means, indicative of temperature at said heat pipe means, with a reference signal corresponding to a predetermined temperature, and producing a control signal in response to the difference between said information signal and said reference signal; and
    (b) power means for receiving said control signal and, in response thereto, operating said thermo-electric cooler to remove heat from said heat pipe means.

5. A system as defined in claim 4 wherein said temperature sensing means comprises a thermistor.

6. A system as defined in claim 5 further comprising vacuum chamber means for at least partially encompassing said heat pipe means with a vacuum.

7. A system as defined in claim 6 wherein said detector assembly and said temperature stabilizing system extend to the interior of a container for enclosing material whose radiation is to be detected.

8. A system as defined in claim 7 wherein said container comprises a conduit for conducting said material.

9. A system as defined in claim 1 wherein said temperature sensing means comprises a thermistor.

10. A system as defined in claim 1 wherein said detector assembly and said temperature stabilizing system extend to the interior of a container for enclosing material whose radiation is to be detected.

11. A system as defined in claim 10 wherein said container comprises a conduit for conducting said material.

* * * * *